United States Patent
Thiruvengadam et al.

(10) Patent No.: US 8,023,336 B2
(45) Date of Patent: Sep. 20, 2011

(54) ERASE COMPLETION RECOGNITION

(76) Inventors: Aswin Thiruvengadam, Mather, CA (US); Robert Minguez, II, Taytay Rizal (PH); Christian Roque, Antipolo City (PH); Ravidath Gurudath, Folsom, CA (US)

( * ) Notice: Subject to any disclaimer, the term of this patent is extended or adjusted under 35 U.S.C. 154(b) by 329 days.

(21) Appl. No.: 12/345,511

(22) Filed: Dec. 29, 2008

(65) Prior Publication Data

US 2010/0165748 A1    Jul. 1, 2010

(51) Int. Cl.
*G11C 11/34* (2006.01)
(52) U.S. Cl. .............. 365/185.29; 365/185.22
(58) Field of Classification Search ........... 365/185.29, 365/185.22
See application file for complete search history.

(56) References Cited

U.S. PATENT DOCUMENTS

| | | | |
|---|---|---|---|
| 6,639,844 B1 * | 10/2003 | Liu et al. | 365/185.3 |
| 7,463,532 B2 * | 12/2008 | Tran et al. | 365/185.29 |
| 2008/0162770 A1 * | 7/2008 | Titiano et al. | 710/309 |

* cited by examiner

*Primary Examiner* — Son T Dinh
*Assistant Examiner* — Nam T Nguyen
(74) *Attorney, Agent, or Firm* — Schwabe Williamson & Wyatt

(57) ABSTRACT

Embodiments include but are not limited to apparatuses and systems including a main memory array, at least one erase status memory cell associated with the main memory array and configured to store a value indicative of an erase completion status of the main memory array, and a control module operatively coupled to the at least one erase status memory cell, the control module configured to perform operations on the main memory array based at least in part on the value stored in the at least one erase status memory cell. Other embodiments may be described and claimed.

15 Claims, 5 Drawing Sheets

ERASE COMPLETION RECOGNITION

TECHNICAL FIELD

Embodiments of the present disclosure relate generally to memory devices, and more particularly, to erase completion recognition in memory devices.

BACKGROUND

Erasing nonvolatile memory tends to be complicated, generally involving several procedures before the memory is available for subsequent operations. As illustrated in FIG. 1, the voltage across the cells decreases during the progression of the erasing operation, in which a series of erase voltage pulses are provided to the cells. An erase-verify operation may then be performed to check if all the cells are fully depleted (i.e., below the erase-verify (EV) voltage), and if not, further erase voltage pulses may be provided to the cells. After the bulk erase operation is completed, some or all of the cells may be soft-programmed to bring the threshold voltages up to within a specified range. This soft-programming is a countermeasure against an overerased state in which a cell threshold voltage is too low. Overerasure can lead to problems such as current leakage and read noise resulting therefrom.

Given the rather involved process of erasing nonvolatile memory, problems have been known to arise when the erase algorithm is interrupted prior to completion. After a power loss, for example, completion of an erase is sometimes verified by checking every address of the memory block(s). Erase completion may be verified if all addresses return all 1's (0xFFFF). All 1's, however, does not necessarily accurately reflect the erase status at least in terms of the charge on the cells. As mentioned, the erase procedure involves not only erasing of the cells (removal of charge) but also a soft-program (addition of charge) to adjust the threshold voltage of the cells to be within a specified range. If the erase algorithm is interrupted prior to the soft-programming step or at some other time when the charge is not within the specified range, functionality or reliability issues can arise.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments of the disclosure are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

Various operations may be described as multiple discrete operations in turn, in a manner that may be helpful in understanding embodiments of the present disclosure; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present disclosure, are synonymous.

As used herein, "coupled," along with its derivatives, may mean one or more of the following. "Coupled" may mean a direct physical or electrical coupling or connection, wherein there is no other element coupled or connected between the elements that are said to be coupled with each other. "Coupled" may also mean an indirect physical or electrical coupling or connection, where one or more other elements are coupled or connected between the elements that are said to be coupled with each other.

For the purposes of the present disclosure, the phrase "A/B" means A or B. The phrase "A and/or B" means "(A), (B), or (A and B)." The phrase "at least one of A, B, and C" means "(A), (B), (C), (A and B), (A and C), (B and C), or (A, B and C)." The phrase "(A)B" means "(B) or (AB)," that is, A is an optional element. In addition, although embodiments of the present disclosure may be shown and described as including a particular number of components or elements, embodiments of the disclosure are not limited to any particular number of components or elements.

Figure 1:
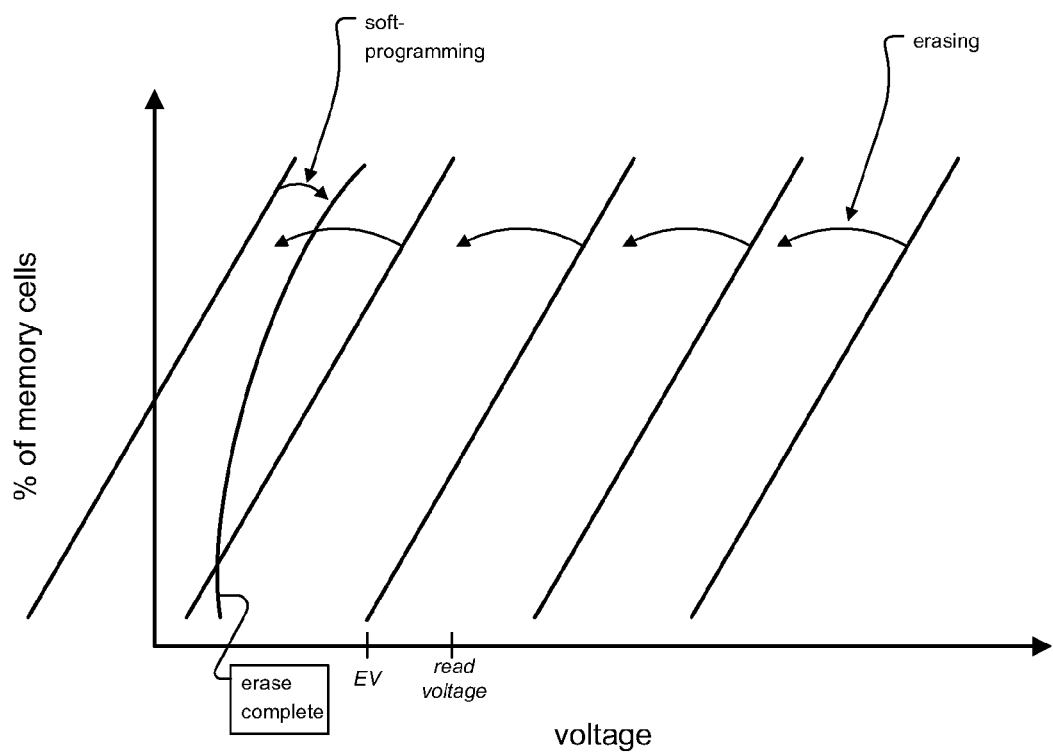
FIG. 1 illustrates the progression of the voltage across memory cells during an exemplary erase operation.
Figure 2:
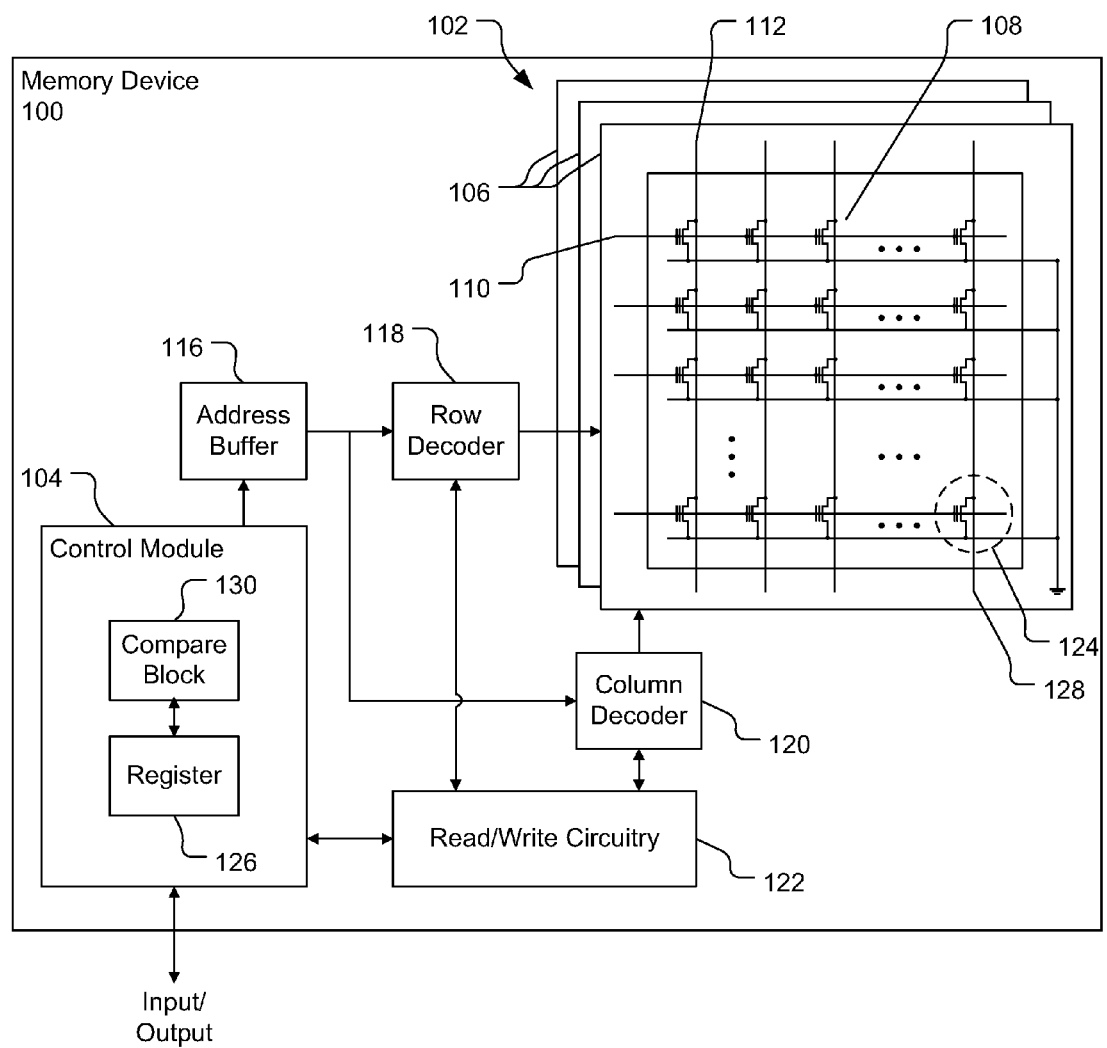
FIG. 2 is a memory device including at least one erase status memory cell in accordance with various embodiments.

Turning now to FIG. 2, illustrated is a memory device 100 in accordance with various embodiments of the disclosure. In various embodiments, the memory device 100 may include a main memory array 102 and a control module 104. The main memory array 102 may include a plurality of addressable memory banks 106, each may include e.g., a plurality of flash memory cells 108 arranged in rows 110 and columns 112, forming wordlines and bitlines, respectively. Each memory bank 106 may contain addressable blocks (or sectors) of memory cells 108.

The memory array 102 may include any suitable memory array. In various embodiments, the memory array 102 may include an array of memory cells that are each formed by a floating gate metal oxide semiconductor (MOS) transistor. In other embodiments, other transistor or transistor-like technologies may be used. In various embodiments, the memory array may include any suitable non-volatile memory such as, but not limited to, NOR flash memory, NAND flash memory, phase change memory, etc.

Data stored in the memory array 102 may be accessed by way of commands provided to the control module 104, which may decode the commands and execute programming and erase algorithms. Addresses may be received by an address buffer 116, and the addresses may be decoded by row decoder circuitry 118, and columns may be accessed by coupling addresses to column decoder circuitry 120. Data may be input and output by way of read/write circuitry 122. Read/write circuitry 122 may include sense amplifiers for read operations as well as analog circuitry for controlling programming and erase voltage generators and controlling the duration of voltage pulses to the memory array 102.

An erase status memory cell 124 associated with the memory array 102 may be configured to store a value indicative of an erase completion status of some portion of the memory array 102. In some embodiments, for example, the erase status memory cell 124 may be configured to indicate that a memory block 106 with which the erase status memory cell 124 is associated has been completely erased. For example, the erase status memory cell 124 may be programmed to read as a logical 0 to indicate that the other memory cells 108 of the memory array 102 are completely erased. On the other hand, if the erase status memory cell 124 is not programmed and reads as a logical 1 (i.e., erased), this may indicate that the other memory cells 108 of the memory array 102 have not been completely erased. Embodiments of the present disclosure are not limited to these values, however. In various embodiments, the erase status memory cell 124 may be programmed with any selected values for indicating the erase completion status of the memory array 102.

Figure 3:
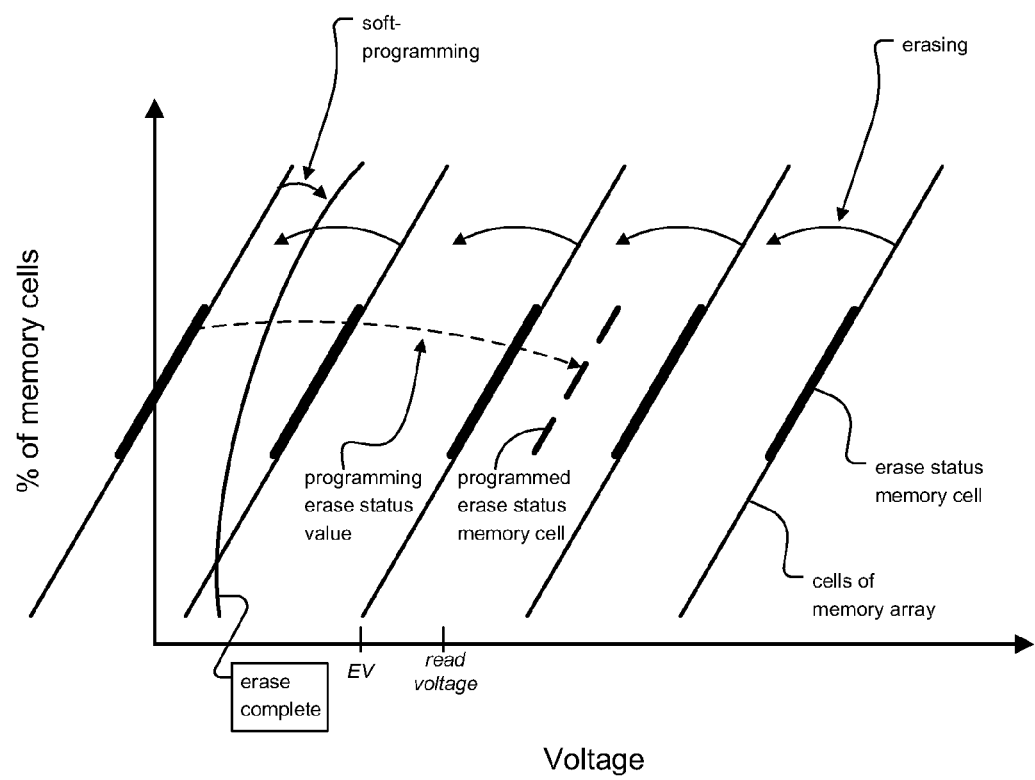
FIG. 3 illustrates the progression of the voltage across memory cells during an exemplary erase operation for a memory device including at least one erase status memory cell.

The value stored in the erase status memory cell 124 may depend, at least in part, on how much of the erase algorithm has been completed, as illustrated in FIG. 3. As an erasing algorithm may comprise several procedures (e.g., erase, verify, soft-program), the stored value may indicate if the erase algorithm has completed or if it was interrupted before completion. As illustrated in FIG. 3, the erase status memory cell may be erased along with the memory cells of some portion of the memory array (e.g., a memory block 106), and so may indicate the erase completion status of the memory cells. After the memory cells of the portion of the memory array are completely erased, then the erase status memory cell may be programmed with the erase status value—here, a logical 0. So, if the erase status memory cell reads anything other than a programmed logical 0, this would indicate an incomplete erase status.

Referring again to FIG. 2, the control module 104 may be operatively coupled to the erase status memory cell 124, and configured to indicate the erase completion status of the main memory array based at least in part on the value stored in the erase status memory cell 124. In embodiments, the erase completion status may be indicated by the control module 104 returning, in response to a read, logical 0's (0x0) for the address if the erase status memory cell 124 is erased (i.e., the stored value is a logical 1). This would indicate that some portion of the memory array 102 has not been completely erased.

In various embodiments, the control module 104 may include a register 126 configured to be coupled to an output of the erase status memory cell 124. The register 126 may be configured to indicate the erase status of some portion of the memory array 102 based at least in part on the value stored in the erase status memory cell 124. The register 126 may be, in some embodiments, a bit mask register having a bit operating to mark the portion of the memory array 102 associated with the erase status memory cell 124 as erased ("clean") or not ("dirty"). Accordingly, the data output from the memory array 102 may be masked based on stored bit. For example, if the erase status memory cell 124 indicates that the memory cells are not completely erased, the read may return (output) a 0x0, whereas if the erase status memory cell 124 indicates that the memory cells are completely erased, the read may instead return the data stored in the addressed cells.

Rather than waiting until a read is attempted, the erase status memory cell 124 may be checked on power up of the memory device 100 and the stored value may be compared against the bit stored in the register 126. The bit stored in the register 126 may then be updated if there has been a change. To that end, the control module 104 may include a compare block 130 configured to read the erase status memory cell 124 and update the register 126 accordingly. In various embodiments, the compare block 130 may comprise a state machine. The state machine may be configured to read the erase status memory cell 124 of each memory block 106 during power up and update the register 126 accordingly.

In various embodiments, the erase status memory cell 124 may be disposed in an erase status column 128. The erase status column 128 may be structurally similar to the other columns 112 of the memory array 102. In fact, in some embodiments, any pre-existing column 112 in a memory block 106 or some other portion of the memory array 102 may be used for the erase status memory column 128. A redundant column, for example, may be used for operating at the erase status column 128. In other embodiments, an additional column may be added to the memory block 106 or other portion of the memory array 102 for use as the erase status column 128.

In embodiments including multiple erase status memory cells 124 in an erase status column 128, each of the erase status memory cells 124 may be configured to indicate an erase completion status of a row 110 associated with that particular erase status memory cell 124.

The memory cells 108 of the memory array 102 may comprise single level or multilevel memory cells, or some combination of both. Similarly, the erase status memory cell(s) 124 of the erase status column 128 may comprise single level or multilevel memory cells, or some combination of both. Multilevel memory cells may be configured to define multiple programming states. For example, multilevel memory cells may define 00 (level 0), 01 (level 1), 10 (level 2), and 11 (level 3) states, for example.

In embodiments in which the erase status memory cell(s) 124 comprise multilevel memory cells, erase completion status as well as data may both be stored. The control module 104 may be configured to output read data based on certain defined programming states. For example, the control module 104 may be configured to return 0x0 for the addressed memory cells if an erase status memory cell 124 is at a level 0 programming state (i.e., no data is returned). If, on the other hand, the erase status memory cell 124 is at a level 1 or level 2, both the value stored in the erase status memory cell 124 as well as the array data may be returned. If the erase status memory cell 124 is, instead, at a level 3, the array data may be returned without the value stored in the erase status memory cell 124. The multiple programming states may be, however, defined in any manner suitable for the particular application.

Figure 4:
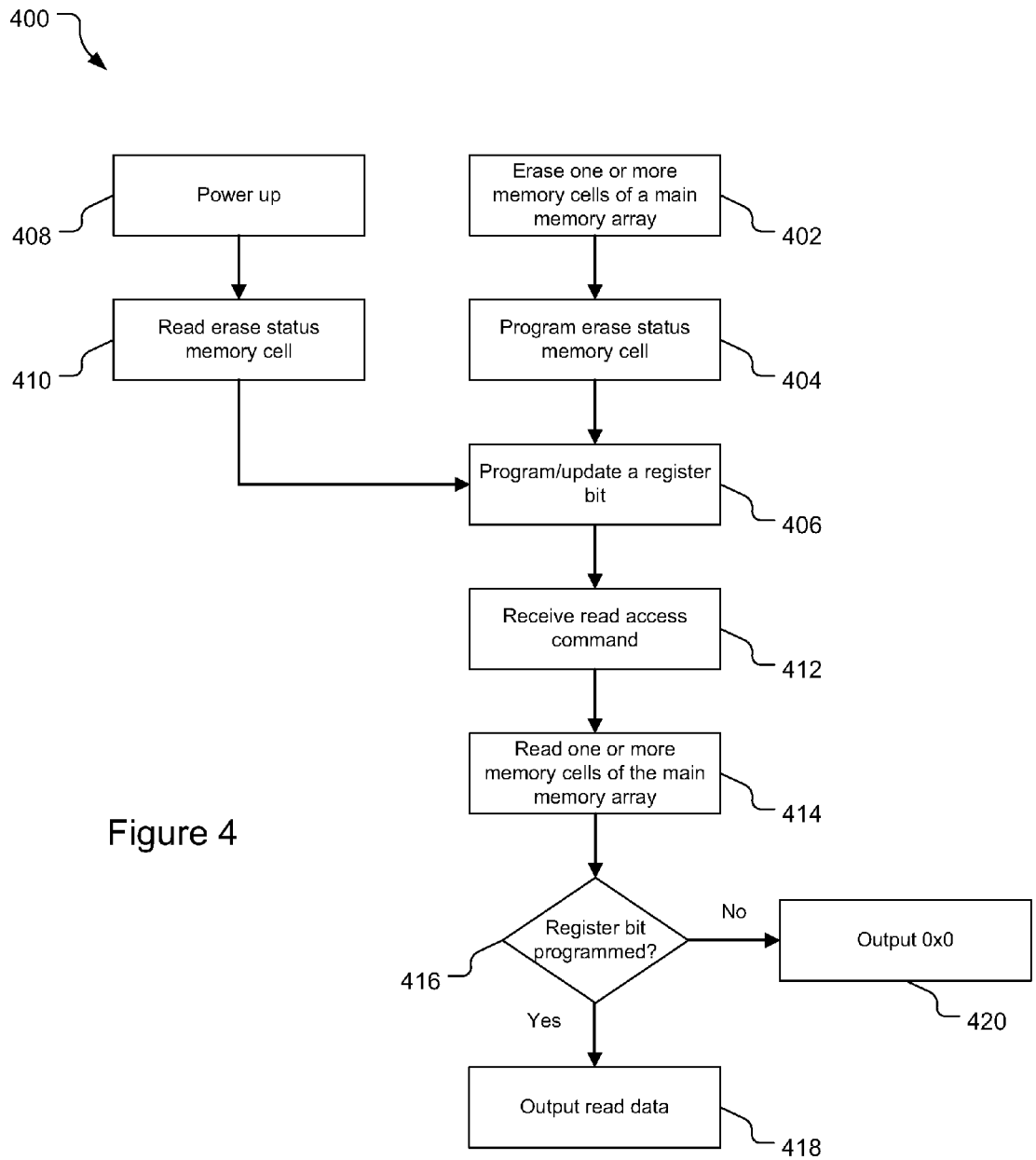
FIG. 4 is a flowchart illustrating operation of a memory device including at least one erase status memory cell in accordance with various embodiments.

FIG. 4 is a flowchart 400 depicting operation of a memory device (e.g., memory device 100 illustrated in FIG. 2) including at least one erase status memory cell in accordance with various embodiments. At block 402, one or more memory cells of a main memory array may be erased, and then at block 404, an erase status memory cell associated with the one or more memory cells of the main memory array may be programmed to indicate the complete erasure thereof.

In various embodiments, a register bit may be programmed in accordance with the value stored in the erase status memory cell (block 406). This register bit may be updated on power up (block 408) after reading the erase status memory cell (block 410).

On receipt of a read access command (block 412), the one or more memory cells of the main memory array may be read (414). If the register bit is programmed (block 416), the read data may be output (block 418). If, on the other hand, the register bit is not programmed, then 0x0, or some other indication of incomplete erasure, may be output (block 420).

Figure 5:
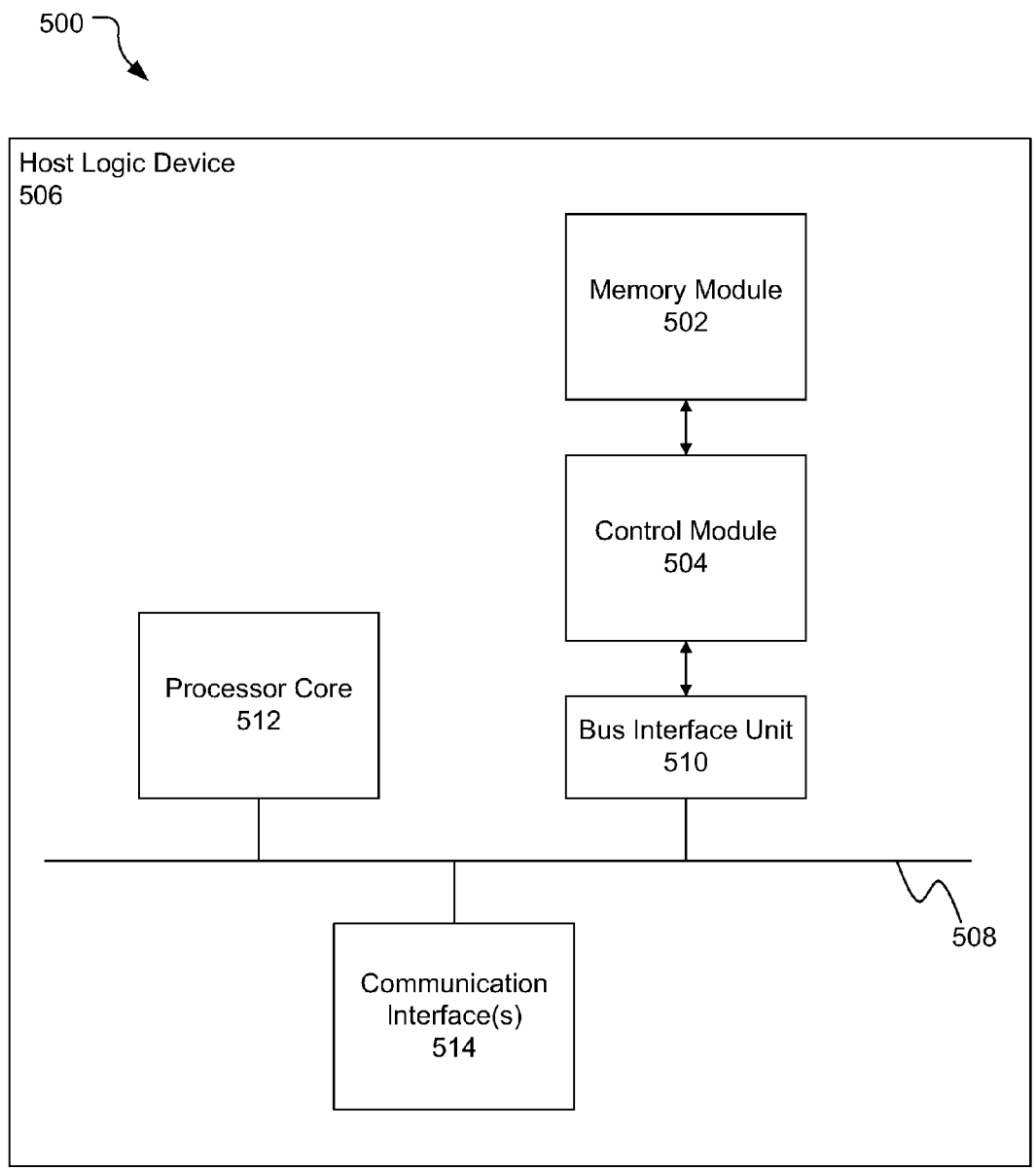
FIG. 5 is a block diagram of a system incorporating a memory device having at least one erase status memory cell in accordance with various embodiments

Embodiments of memory devices described herein may be incorporated into various apparatuses and systems, including but are not limited to various computing and/or consumer electronic devices/appliances, such as desktop or laptop computers, servers, set-top boxes, digital reorders, game consoles, personal digital assistants, mobile phones, digital media players, and digital cameras. A block diagram of an exemplary system 500 is illustrated in FIG. 5. As illustrated, the system 500 may include a memory module 502 and a control module 504 operatively coupled to the memory module 502. The memory module 502 may include a main memory array and at least one erase status memory cell associated with the main memory array (such as, for example, array 102 and erase status memory cell(s) 124 illustrated in FIG. 2). The control module 504 may be configured to indicate an erase completion status of the main memory array based at least in part on the value stored in the at least one erase status memory cell of the memory module 502.

In various embodiments, the memory module 502 and the control module 504 may be embedded in a host logic device 506. The host logic device 506 may be any device type for which flash memory may be embedded. For example, in various embodiments, the host logic device 506 may be a microcontroller or a digital signal processor. Other device types may be similarly suitable. The host logic device 506 may include a processor core 512.

The system 500 may comprise a host logic device bus 508, and a bus interface unit 510 operatively coupling the control module 504 and the host logic device bus 506.

The system 500 may include communications interface(s) 514 to provide an interface for system 500 to communicate over one or more networks and/or with any other suitable device. Communications interface(s) 514 may include any suitable hardware and/or firmware. Communications interface(s) 514 for one embodiment may include, for example, a network adapter, a wireless network adapter, a telephone modem, and/or a wireless modem. For wireless communications, communications interface(s) 514 for one embodiment may use one or more antennas (not illustrated).

Although the present disclosure has been described in terms of the above-illustrated embodiments, it will be appreciated by those of ordinary skill in the art that a wide variety of alternate and/or equivalent implementations calculated to achieve the same purposes may be substituted for the embodiments shown and described without departing from the scope of the present disclosure. Similarly, memory devices of the present disclosure may be employed in host devices having other architectures. Those with skill in the art will readily appreciate that embodiments in accordance with the present disclosure may be implemented in a very wide variety of embodiments. This description is intended to be regarded as illustrative instead of restrictive.

What is claimed is:

1. An apparatus of comprising:
a main memory array;
at least one erase status memory cell associated with the main memory array; and
a control module operatively coupled to the at least one erase status memory cell, the control module configured to indicate an erase completion status of the main memory array based at least in part on a value stored in the at least one erase status memory cell;
wherein the control module includes a register configured to connect to an output of the at least one erase status memory cell, the register configured to indicate the erase completion status of the main memory array; and
wherein the control module includes a compare block configured to read the at least one erase status memory cell and update the register on powering up of the apparatus.

2. The apparatus of claim 1, wherein the main memory array includes a plurality of memory cells arranged in an erase status column, and wherein the erase status column includes the at least one erase status memory cell.

3. The apparatus of claim 1, wherein the main memory array comprises a plurality of rows of memory cells, and wherein the at least one erase status memory cell is configured to indicate an erase completion status of at least one row of the plurality of TOWS.

4. The apparatus of claim 1, wherein the register is a bit mask register.

5. The apparatus of claim 1, wherein the compare block comprises a state machine.

6. The apparatus of claim 1, wherein the main memory array comprises NOR flash memory cells.

7. An apparatus comprising:
a main memory array;
at least one erase status memory cell associated with the main memory array; and
a control module operatively coupled to the at least one erase status memory cell, the control module configured to indicate an erase completion status of the main memory array based at least in part on a value stored in the at least one erase status memory cell;
wherein the at least one erase status memory cell includes a multi-level memory cell defining multiple programming states; and
wherein the control module is configured to cause a read of the main memory array and the value stored in the at least on erase status memory cell when the multi-level memory cell is in a first programming state, and to cause a read of the main memory array without reading the value stored in the at least on erase status memory cell when the multi-level memory cell is in a second programming state.

8. A method comprising:
erasing one or more memory cells of a main memory array;
after erasing the one or more memory cells, programming at least one erase status memory cell associated with the main memory array to indicate an erase completion status of the main memory array;
programming a register based at least in part on a value stored in the erase completion status memory cell; and
reading the at least one erase status memory cell and updating the register on powering up of the apparatus.

9. The method of claim 8, wherein the programming of the at least one erase status memory cell comprises programming at least one erase status memory cell to indicate an erase completion status of at least one row of the main memory array.

10. A system comprising:
a memory module including a main memory array and at least one erase status memory cell associated with the main memory array;
a control module operatively coupled to the memory module, the control module configured to indicate an erase completion status of the main memory array based at least in part on a value stored in the at least one erase status memory cell, wherein the control module includes a register configured to connect to an output of the at least one erase status memory cell, the register configured to indicate the erase completion status of the memory module, and wherein the control module includes a compare block configured to read the at least one erase status memory cell and update the register on powering up of the apparatus;

a host logic device bus; and a bus interface unit operatively coupling the control module and the host logic device bus.

11. The system of claim 10, wherein the memory module and the control module are embedded in a host logic device.

12. The system of claim 11, wherein the host logic device is a microcontroller or a digital signal processor.

13. The system of claim 11, further comprising a processor core operatively coupled to the host logic device bus.

14. The system of claim 10, wherein the main memory array comprises a plurality of rows of memory cells, and wherein the at least one erase status memory cell is configured to indicate an erase completion status of at least one row of the plurality of TOWS.

15. The system of claim 10, wherein the system is a selected one of a desktop computer, a laptop computer, a server, a set-top box, a digital recorder, a game console, a personal digital assistant, a mobile phone, a digital media player, or a digital camera.

* * * * *